United States Patent
Gnauck et al.

[11] Patent Number: 5,963,570
[45] Date of Patent: Oct. 5, 1999

[54] CURRENT CONTROL FOR AN ANALOG OPTICAL LINK

[75] Inventors: Alan H. Gnauck, Middletown; Sheryl Leigh Woodward, Holmdel, both of N.J.

[73] Assignee: AT&T Corp., Middletown, N.J.

[21] Appl. No.: 08/854,315

[22] Filed: May 12, 1997

[51] Int. Cl.⁶ .................................................. H01S 3/10
[52] U.S. Cl. .................................................. 372/38; 372/46
[58] Field of Search .................... 372/33, 38, 43, 372/46

[56] References Cited

U.S. PATENT DOCUMENTS

| | | | |
|---|---|---|---|
| 3,946,335 | 3/1976 | DeLoach, Jr. et al. | 372/38 |
| 4,009,385 | 2/1977 | Sell | 250/199 |
| 4,081,670 | 3/1978 | Albanese | 372/38 |
| 4,109,217 | 8/1978 | Brackett et al. | 372/38 |
| 4,292,606 | 9/1981 | Trimmel | 332/7.51 |
| 4,355,395 | 10/1982 | Salter et al. | 372/38 |
| 4,484,331 | 11/1984 | Miller | 372/38 |
| 4,701,609 | 10/1987 | Koishi et al. | 250/205 |
| 4,876,442 | 10/1989 | Fukushima | 250/205 |
| 4,903,273 | 2/1990 | Bathe | 372/38 |
| 4,945,541 | 7/1990 | Nakayama | 372/38 X |
| 4,958,926 | 9/1990 | Bu-Abbud | 356/73.1 |
| 5,073,983 | 12/1991 | Pfizenmayer | 359/187 |
| 5,260,955 | 11/1993 | Davis et al. | 372/31 |
| 5,402,433 | 3/1995 | Stiscia | 372/31 |
| 5,412,675 | 5/1995 | Odagawa | 372/33 X |
| 5,488,621 | 1/1996 | Slawson et al. | 372/31 |
| 5,675,599 | 10/1997 | Abe et al. | 372/38 |

FOREIGN PATENT DOCUMENTS

| | | |
|---|---|---|
| 56-130370 | 10/1981 | Japan . |
| 64-7678 | 1/1989 | Japan . |

*Primary Examiner*—John D. Lee
*Attorney, Agent, or Firm*—Morgan & Finnegan, LLP; Joseph C. Redmond, Jr.

[57] ABSTRACT

A control circuit for an injection laser provides a pre-bias current which prevents clipping induced errors in the laser output. An analog modulating signal is provided directly to the laser which receives the sum of a feedback current (Ifb) and a current source (Io) as the pre-bias current (Ipb). A monitor diode detects the laser light output and provides a current (Idet). A feedback circuit operates in a limited dynamic range, e.g. $I_f$+/−40 mA or is incapable of outputting a negative current (Ifb>0). The feedback circuit responds to changes in Idet and adjusts the laser pre-bias current to hold Idet equal to a preset value, which effectively holds the laser's average output power constant. If the pre-bias current necessary to hold Idet fixed falls below some minimum level, Imin, the feedback circuit will run out of dynamic range and the laser's average power will increase. By preventing Ipb from falling below Imin clipping induced errors and distortion are avoided.

14 Claims, 3 Drawing Sheets

CURRENT CONTROL FOR AN ANALOG OPTICAL LINK

BACKGROUND OF INVENTION

1. Field of Invention

This invention relates to control circuits. More particularly, the invention relates to control circuits for optical links using semiconductor lasers.

2. Description of Prior Art

When directly modulated semiconductor lasers are used in an analog link the pre-bias current is normally set so that the lasers average output power remains constant. This is done with a simple feedback circuit. Without such a circuit the laser's pre-bias current would need to be set high enough to insure that the laser's average output power was adequately high over the laser's lifetime, and over the operating temperature range. Such a high pre-bias current may cause the laser to output too much power when new, or when the laser temperature is low: excess optical power can saturate a receiver or induce fiber non-linearity, thus degrading system performance. Operating the laser at high current can also accelerate aging of the laser. Therefore, using a constant bias current may degrade system performance.

When this simple prior art feedback circuit is used with uncooled lasers (laser modules lacking temperature control), the pre-bias current will get lower at lower temperatures, and as the pre-bias current falls the link becomes more susceptible to clipping-induced errors. These errors occur when the laser current (the sum of the pre-bias current and the modulating signal) falls below the lasing threshold.

Prior art related to controlling the laser pre-bias current is as follows:

U.S. Pat. No. 4,009,385 issued Feb. 22, 1977, discloses a control circuit for an injection laser including a driver circuit which applies a driving current to the laser in response to an electrical modulating signal. A pre-bias circuit applies a pre-bias current to the laser in response to the difference between a signal derived from the electrical modulating signal and a signal derived from the laser light output.

U.S. Pat. No. 4,292,606 issued Sep. 29, 1981, discloses a circuit which senses the time intervals during which a total current applied to a laser diode exceeds a second break point value on the light-current characteristic curve and which generates an error signal that may be fed back to adjust a current modulator.

U.S. Pat. No. 4,484,331 issued Nov. 20, 1984, discloses a current regulator circuit using electrical feedback to stabilize the bias current of semiconductor laser diodes. Laser diode current is sensed with negative-temperature-coefficient resistance to develop voltages which are compared with zero-temperature coefficient voltages thereby generating error signals, which regulate emission from the laser diode against changes with temperature.

U.S. Pat. No. 4,903,273 issued Feb. 20, 1990, discloses a control circuit in which the operating point of the laser diode is positioned in the portion of the characteristic curve in which the ratio of the slope of the characteristic curve to the slope of the characteristic curve in the linear portion of the characteristic curve is equal to a predetermined value. This ratio is obtained by measuring a change in the bias current which compensates for power change caused by a change of the modulation current.

U.S. Pat. No. 4,958,926 issued Sep. 25, 1990, discloses a closed loop control system for a laser in which the output light of the laser and light from a fiber to which the laser light is coupled initially sets the bias and pulse current amplitude to the laser and adjusts the gain of the receiver which is part of the control system. In response to light from the fiber the control system continuously controls the pulse current amplitude and receiver gain so that the amplitude or the electrical signal representative of the light is kept within the operating range of the receiver electronics.

U.S. Pat. No. 5,073,983 issued Dec. 17, 1991, discloses an amplitude modulated optical signaling system having improved linearity and reduced distortion by detecting a portion of the optical output from the light emitter to obtain an electrical feedback and phase reversing a first portion of feedback signal and degeneratively combining it with the electrical input of the signal to obtain a combined signal for ac modulating the light emitter. The second portion of feedback signal is desirably time averaged and used to control the DC drive to a light emitter so that the average light output is substantially constant. The distortion otherwise introduced in the optical signaling system by the non-linearity associated with the optical emitters driven at high power levels is reduced.

U.S. Pat. No. 5,260,955 issued Nov. 9, 1993, discloses automatically setting a threshold current for a laser diode which has a linear laser operating region and a lower non-linear operating region. The laser diode is controlled (1) during a warm up period, during which no operating current is supplied to the laser diode, to allow the electronics and laser diode to stabilize; (2) during an initialization period, during which the current for the laser diode is brought up to a threshold operating point above said non-linear operating region and during which no image data is applied to the laser diode; and (3) during an operating period in which digital image data is applied to the laser diode to operate it in the linear laser operating region.

None of the prior art discloses a control circuit for a laser which (1) achieves minimum average laser output power and (2) prevents clipping induced errors in the laser output by forcing the average laser output power to exceed the minimum when the pre-bias current would otherwise fall below a minimum value.

SUMMARY OF THE INVENTION

This invention solves the problem of supplying a laser with constant minimum current, so that at low temperature the laser pre-bias does not fall below a minimal acceptable value, but at higher temperatures the laser pre-bias is controlled so that the average light output remains constant. By so doing, clipping induced errors are prevented from occurring at low temperatures while assuring sufficient light will be emitted at high temperatures.

A bias control circuit for an injection laser in an optical link includes a monitor diode, a feedback circuit and a current source. In response to a modulating signal, the laser emits modulated light which is provided to an optical link. The monitor diode generates a current (Idet) which is proportional to the average laser output power. Idet is provided to the feedback circuit, which then adjusts its output current so that Idet approaches a preset value indicative of a constant laser average output power. The feedback circuit has a limited range and does not provide a negative feedback current. The feedback current (Ifb) varies as Idet changes with respect to the pre-set value. Ifb is combined with a current (Io) from a current source to form a pre-bias current (Ipb) for the laser upon which the modulating signal is superimposed. As the temperature falls, the pre-bias current necessary to maintain constant average output power falls. The pre-bias current will fall until it reaches a minimal value below which it will not be reduced thereby preventing clipping induced errors in the laser output signal.

DESCRIPTION OF THE DRAWING

The invention will be further understood from the following description of preferred embodiment taken in conjunction with the appended drawing, in which.

DESCRIPTION OF PREFERRED EMBODIMENT

Figure 1:
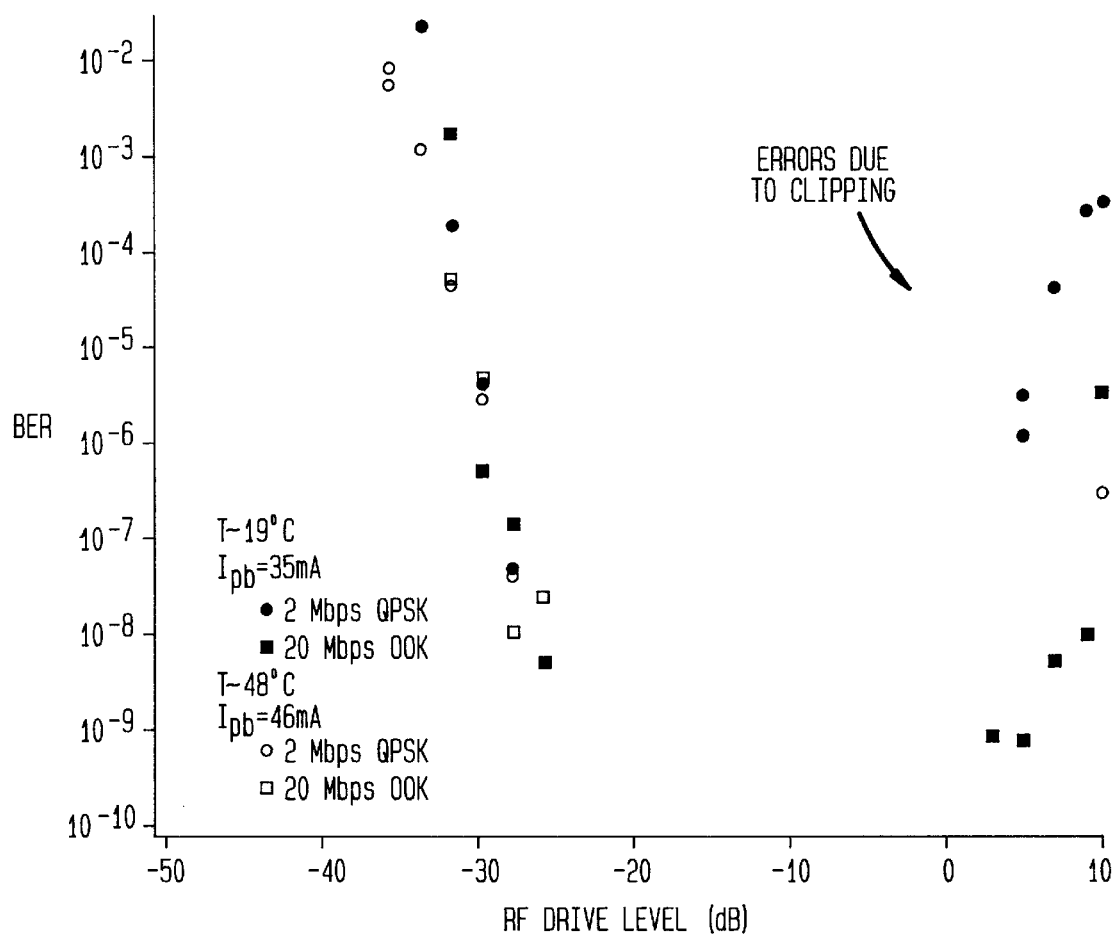
FIG. 1 is a logarithmic graph of a laser test operation showing clipping errors in terms of Bit Error Rate (BER) on the vertical axis and RF Drive in dB on the horizontal axis for an injection laser operating at: (a) 19° C. and a 35 mA pre-bias current (Ipb) or (b) 48° C. and a 46 mA pre-bias current (Ipb), the BER being measured on two data channels, one transmitting a 2 Mbps quadrature-phase-shift keyed signal at 980 MHz and the other transmitting a 20 Mbps on-off keyed signal at 947 MHz.

In FIG. 1, an injection laser was operated using a pre-bias current such that the laser average output power was held constant while measuring errors in the laser output signal with respect to the power in the analog input signal. At the low operating temperature of 19° C. the laser pre-bias and slope efficiency were greater than at the higher operating temperature of 48° C. and clipping errors were observed in both data channels as represented by the black dots and squares at the higher pre-bias RF drive level. At the higher operating temperature the pre-bias level was maintained and clipping errors were not observed, until the power in the analog input signal was 7 dB larger than where clipping induced errors were seen at 19° C. This implies that at the lower temperature the optical link does not perform properly with the larger drive levels. The invention solves this problem by always pre-biasing the laser above some minimal value Imin rather than simply setting the pre-bias so that the laser average output power is constant. This minimum pre-bias current is below the level that would be necessary if no feedback was used and the pre-bias current was set to a constant value which was large enough to insure that the laser's average output power was always sufficiently high.

Figure 2A:
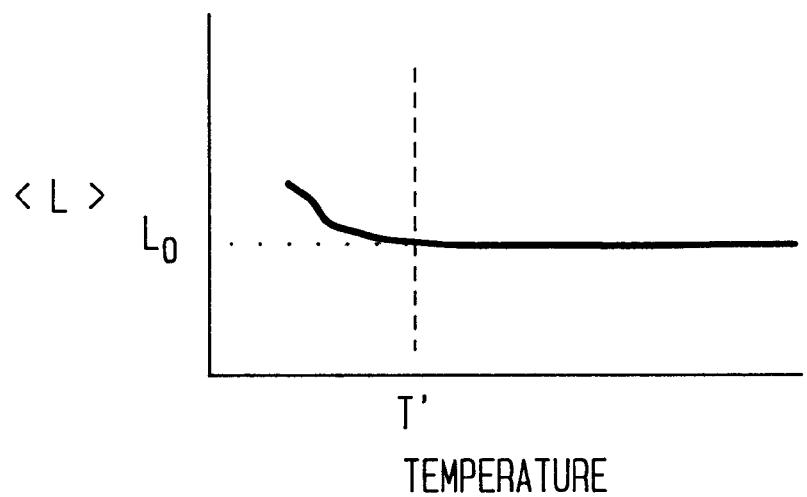
FIG. 2A is a graph showing laser average output power <L> versus operating temperature (T) when the invention is used.
Figure 2B:
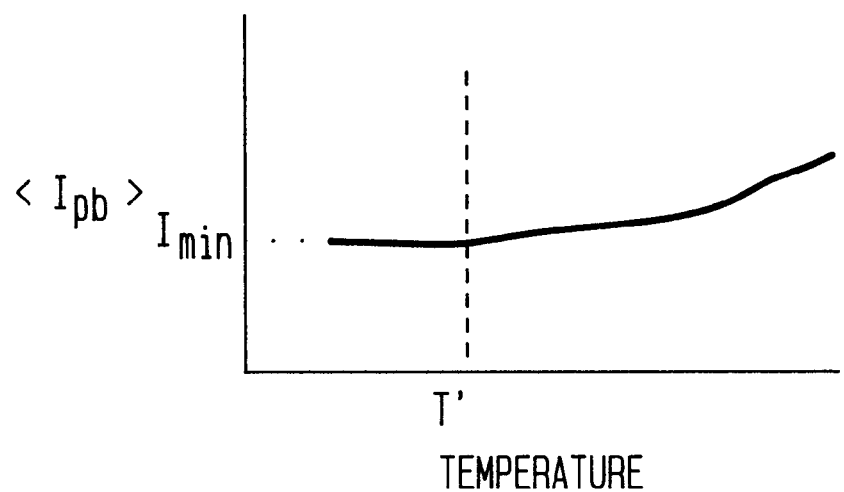
FIG. 2B is a graph showing laser pre-bias current (Ipb) versus laser operating temperature when the invention is used.

FIGS. 2A and 2B show how the laser's average output power and pre-bias current vary with laser operating temperature when the present invention is employed.

The laser pre-bias current (Ipb) is described by the following equation:

$$Ipb = \begin{cases} Ia \text{ such that } \langle L(Ia) \rangle = Lo \text{ if } Ia > Imin \\ Imin \end{cases} \quad (1)$$

where:
Ia=current specified by pre-bias circuit (See FIG. 2 I(pb)+Io).
L(Ia)=laser output as function of Ia.
Lo=preset average laser output power.

When the laser is modulated:
I=Ipb+modulating signal Ipb=Iac (t).
where:
Iac (t) is the input signal as a function of time.
Accordingly, to prevent clipping Imim should be chosen such that:

$Ipb+Iac(t)>Ith$ at all times.

In a real system the instantaneous magnitude of Iac(t) may cover a wide range but the largest values might occur very rarely. A limited amount of clipping may be acceptable. The system should be designed so that the excursions below Ith are within an acceptable range, and occur rarely. The acceptable range and how often it is acceptable to clip the signal will depend on the modulation format used, whether error-correction coding is used, and the service being provided.

Ith will vary with temperature, and tends to decrease as the temperature falls. To choose a value of Imin that will insure adequate performance over the entire operating temperature range, Imin should be chosen such that the laser can never be driven below threshold. Let n be the laser's slope efficiency (mW of light output per mA of current input), and a function of temperature (where n tends to increase as the temperature falls). If the laser is pre-biased such that <L>= Lo, then L(t)=Lo+(Iac(t)×n).

To insure that the laser is not driven below threshold L(t)=(Ipb+Iac−Ith)×n must remain positive. Recall that n is a function of the laser temperature T. We denote the maximum value of (−1×Iac) as Iac,m. Let T' be the temperature at which (Iac,m×n(T')=Lo. Then Imin should be set to Imin=Ith(T=T')+Iac,m. This will insure that when Ith<Ith(T'), and n>(Lo/Iac.m), Ipb will be set to Imin, and L(t)>0.

[To see that $L(t) > 0$, recall that:

$$L(t) \cong \{[(Imin - Ith(T))] + Iac(t)\} \times n$$
$$= \{(Ith(T = T') + Iac, m) - Ith(T) + Iac(t)\} \times n$$
$$= \{(Ith(T') - Ith) + (Iac, m + Iac(t)) \times n > 0 \text{ since}$$
$$n > 0, \{Ith(T') > Ith\} \text{ AND } (Iac, m > -1 \times Iac(t))]$$

When Ith>Ith(T'), and n<(Lo/Iac,m), Ipb will be set so that <L>=Lo, which will be above Imin.

Then: L(t)≅Lo+Iac(t)×n

Clearly, when designing the system both Imin and Iac are within the system designer's control, and there will be trade-off's in setting these values. If a limited amount of clipping is acceptable, then Imin can be set to a lower value, (e.g., if one clipping event per minute is acceptable and −1×Iac(t) exceeds Iac,z only once per minute, Iac,z could replace Iac,m in the equation above.

Over time a laser's slope efficiency tends to decrease and its threshold current tends to increase, so that a proper choice of Imin when the laser is new should prevent or reduce clipping errors to an acceptable level in the laser output signal over the life of the laser. Thus, setting Imin=Ith(T= T')+Iac,max will prevent or reduce to an acceptable level clipping errors in optical links using injection lasers.

Even in an optical link using a temperature controlled laser the invention has application in a system which sends analog signals in bursts.

When a laser's response is linear, then the average output of the laser will be a function of the average current input. <L(I)>=L(<I>). If the laser's response is not linear then this equation will not hold true. In a system sending analog signals continuously this effect will not present a problem, as a traditional feedback circuit will set <L>=Lo. However, when the laser is sending packets of data in bursts, <L> will change when packets are being sent if the laser's response is non-linear. Since a traditional feedback circuit must have a long time constant (or it will degrade the signal being sent) it will be difficult to design a control loop which is able to correct on a packet time scale to changes in <L>. If few data packets are being sent, then the feedback circuit may set Ipb to a lower value than when many packets of data are being transmitted. This invention prevents the feedback circuit setting the pre-bias current too low. Thus the invention is also applicable in systems where the threshold current and slope efficiency are not varying with temperature.

Figure 3:
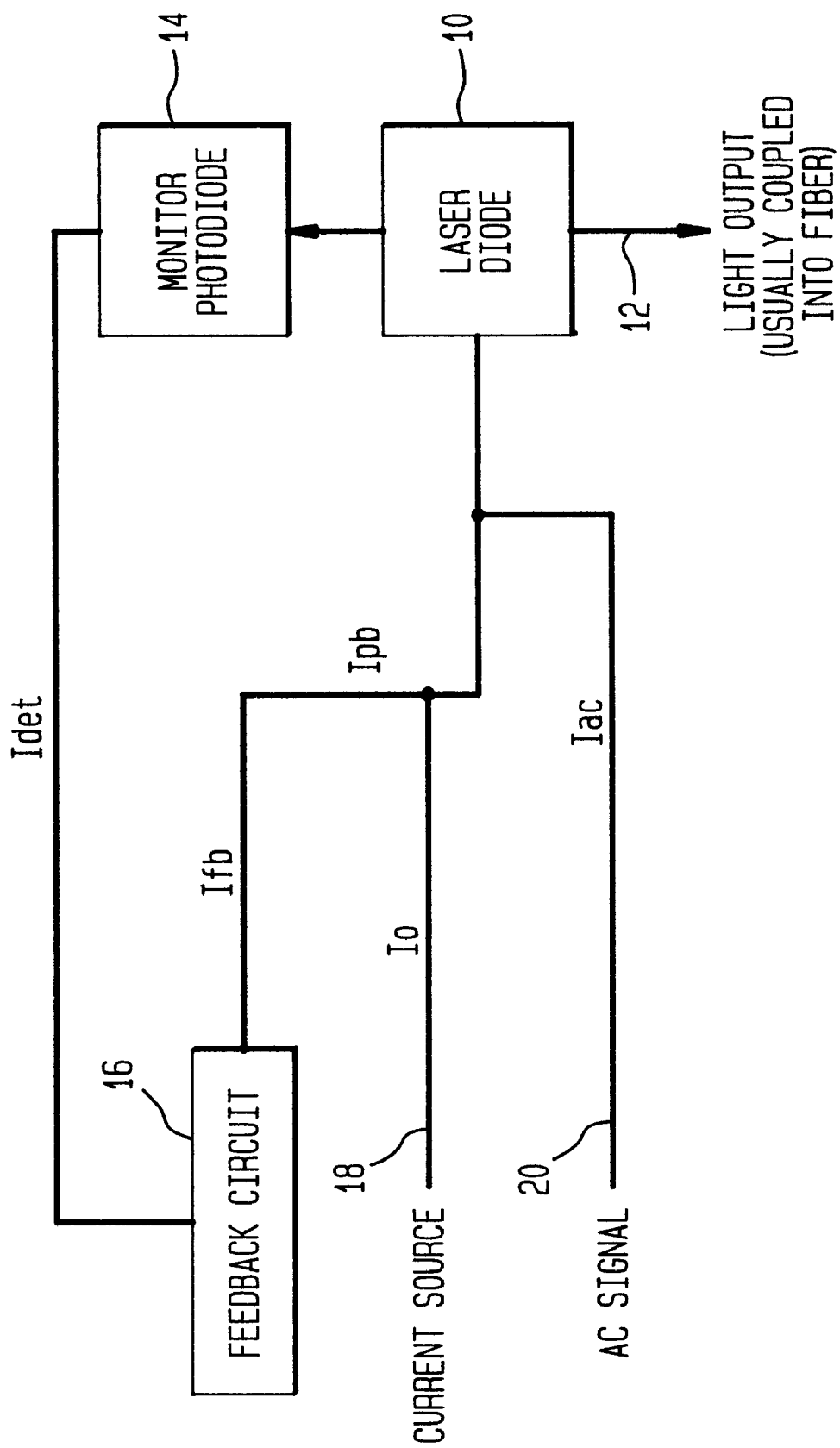
FIG. 3 is a pre-bias control circuit for a laser which prevents or reduces clipping errors in accordance with the principles of the present invention.

Turning to FIG. 3, a pre-bias control circuit for a laser includes a feedback circuit providing Ifb and a current source providing Io. When the control circuit minimum output current (Imin=Io+Ifb,min) is set to Imin=Ith(T=T')+Iac,max, unacceptable clipping errors are prevented, regardless of the laser operating temperature.

In FIG. 3 a laser diode 10 is coupled into an optical link 12 and provides light output to a monitor diode 14. The diode 14 generates a current Idet, proportional to the laser diode 10 output. Idet is provided as an input to a feedback circuit 16 which provides an output current Ifb. The output current Ifb has a limited dynamic range (e.g Ifb is between I1=/−40 mA, or Ifb>0). Feedback circuits of this type are commercially available. A current source 18 provides the output current Io which is combined with Ifb to form a pre-bias current Ipb for the laser 10. A modulating signal source 20 provides a signal Iac which is superimposed on Ipb as the input to the laser diode 10. The feedback circuit attempts to hold <Idet> equal to a preset constant value by adjusting Ifb, which changes the laser's DC current (Ipb=Ifb+Io). The limited dynamic range of the feedback circuit will prevent the laser's DC current from falling below a minimum value. Thus, as the operating temperature of the laser 10 falls, the feedback circuit will hold the average output power of the laser 10 constant until Ipb=Imin=Io+Ifb, min. (Ifb, min could be zero). The laser output will then increase, but the laser current will not fall below the minimum preset value.

In the prior art, as the diode operating temperature drops the laser slope efficiency will increase and its threshold current will fall. In a conventional control circuit, the laser pre-bias current would lower to the point where Idet would equal the preset value. This condition can cause the modulating current Iac to drive the laser below the threshold current Ith inducing distortion and errors. The present feedback circuit is incapable of driving the laser below a preset value (e.g. Ipb>Io+Ifb,min) and clipping induced errors are prevented or held within an acceptable range.

While the invention has been shown and described in respect to a preferred embodiment, various changes may be made in the embodiment without departing from the spirit or scope of the invention, as defined in the appended claims:

We claim:

1. A control circuit for a laser to provide a minimal light output, comprising:
   a) a laser diode;
   b) an input data signal to the laser;
   c) a monitor diode coupled to the light output of the laser and generating a current Id proportional to the laser light output;
   d) a feedback circuit receiving the current Id and providing an output current Ifb;
   e) a current source providing a current Io;
   f) means for combining the currents Ifb and Io as a pre-bias current for the laser;
   g) means for operating the feedback circuit to achieve a minimal pre-bias current to the laser and light output from the laser as the laser operating temperature varies between a low and a high operating temperature and wherein the pre-bias current does not fall below a minimum current level and is set to a minimum level defined by Imin=Ith(T=T')+Iac,max where: Ith=the laser threshold current at operating temperature T'; Iac,max is the maximum of [−1×Iac(t)], (Iac(t) is the AC signal input to the laser); and T' is the temperature where (Iac,min)×(the laser's slope efficiency)=Lo.

2. The control circuit of claim 1 wherein the feedback circuit does not provide a negative output level.

3. The control circuit of claim 1 wherein the input signal may be a continuous analog signal or a packet burst.

4. The control circuit of claim 1 wherein the input signal is supplied directly to the laser input.

5. A control circuit for a laser to provide a minimal light output, comprising:
   a) a laser diode providing a light output;
   b) a feedback circuit receiving the light output and providing an output current Ifb;
   c) a current source providing a current Io;
   d) means for combining the currents Ifb and Io as a pre-bias current for the laser; and
   e) means for operating the feedback circuit to achieve a minimal pre-bias current to the laser and light output such that the laser average output power is at least equal to a predetermined light output value (Lo), where Lo is non-zero and wherein the pre-bias current does not fall below a minimum current level and is set to a minimum level defined by Imin=Ith(T=T')+Iac,max where: Ith=the laser threshold current at operating temperature T'; Iac,max is the maximum of [−1×Iac(t)], (Iac(t) is the AC signal input to the laser); and T' is the temperature where (Iac,min)×(the laser's slope efficiency)=Lo.

6. In a control circuit for a laser, the control circuit including a monitor diode coupled to the laser and to a feedback circuit which in conjunction with a current source provides a pre-bias current to the laser, a method for controlling the laser output power comprising the steps of:
   a) generating a feedback current (Ifb) in the feedback circuit;
   b) generating a current value Io from a current source;
   c) combining the feedback current and the current source current as a pre-bias current to the laser (Ipb) wherein the pre-bias current does not fall below a minimum current level and is set to a minimum level defined by Imin=Ith(T=T')+Iac,max where: Ith=the laser threshold current at operating temperature T'; Iac,max is the maximum of [−×Iac(t)], (Iac(t) is the AC signal input to the laser); and T' is the temperature where (Iac,min)×(the laser's slope efficiency)=Lo;
   d) providing an input signal to the laser as an input signal superimposed on the pre-bias current;
   e) generating a current Id in the monitor diode, the current Id being proportional to the laser output light;
   f) supplying Id to the feedback circuit; and
   g) varying the current from the feedback circuit to the laser so that the pre-bias current is above a minimal value (Imin) and as Id changes with respect to a preset value, the pre-bias current is adjusted so that the average light output from the laser is held above a minimum value (Lo).

7. The method of claim 6 further comprising the step of:
   h) operating the feedback circuit such that Ifb is always positive.

8. The method of claim 6 further comprising the step of:
   h) operating the feedback circuit within a limited dynamic range.

9. The method of claim 6 wherein an input signal may be a continuous analog signal or a packet burst.

10. A method of operating an optical transmission system comprising the steps of:
    a) setting a laser pre-bias current (Ipb) to be greater than, or equal to a predetermined value (Imin) wherein the minimum pre-bias current for the laser is set to Imin=Ith(T=T')+Iac,m where: Ith=(T) is the laser threshold current at operating temperature T'; Iac,m is the maximum of [−1×Iac(t)], (Iac(t) is the AC signal input to the laser); and T' is the temperature where (Iac,m)×(the laser's slope efficiency)=Lo; and
    b) maintaining Ipb above the predetermined value such that the laser average output power is at least equal to a predetermined light output value (Lo).

11. The method of claim 10 further comprising the step of:
    c) controlling the pre-bias current to achieve a minimal average light output when operating the laser at a low temperature.

12. The method of claim 10 further comprising the step of:
    c) controlling the pre-bias current to achieve a constant light output when operating the laser at a high temperature.

13. In a control circuit for a laser, the control circuit including a monitor diode coupled to the laser and to a feedback circuit which provides a pre-bias current to the laser, a method for controlling the laser output power comprising the steps of:
    a) generating a pre-bias current Ipb in the feedback circuit wherein the pre-bias current does not fall below a minimum current level and is set to a minimum level defined by Imin=Ith(T=T')+Iac,max where: Ith=the laser threshold current at operating temperature T': Iac,max is the maximum of [−1×Iac(t)], (Iac(t) is the AC signal input to the laser); and T' is the temperature where (Iac,min)×(the laser's slope efficiency)=Lo;
    b) providing an input signal to the laser as an input signal superimposed on the pre-bias current;
    c) generating a current Id in the monitor diode, the current Id being proportional to the laser output light;
    d) supplying Id to the feedback circuit; and
    e) varying the current from the feedback circuit to the laser so that the pre-bias current is above a minimal value (Imin), and as Id changes with respect to a preset value, the pre-bias current is adjusted so that the average light output from the laser is held above a minimum value (Lo).

14. A method of operating an optical transmission system comprising the steps of:
    a) setting a laser pre-bias current (Ipb) to be greater than, or equal to a predetermined value (Imin); and
    b) maintaining Ipb above the predetermined value such that the laser average output power is at least equal to a predetermined light output value (Lo), where Lo is non-zero and wherein the pre-bias current does not fall below a minimum current level and is set to a minimum level defined by Imin=Ith(T=T')+Iac,max where: Ith= the laser threshold current at operating temperature T'; Iac,max is the maximum of [−1×Iac(t)], (Iac(t) is the AC signal input to the laser); and T' is the temperature where (Iac,min)×(the laser's slope efficiency)=Lo.

\* \* \* \* \*